United States Patent [19]

Kowalski et al.

[11] Patent Number: 5,097,146
[45] Date of Patent: Mar. 17, 1992

[54] CIRCUIT FOR DETECTING HIGH VOLTAGE LEVEL IN MOS TECHNOLOGY

[75] Inventors: Jacek Kowalski; Christophe Chevallier, both of Trets, France

[73] Assignee: SGS Thomson-Microelectronics SA, Gentilly, France

[21] Appl. No.: 658,449

[22] Filed: Feb. 22, 1991

Related U.S. Application Data

[63] Continuation of Ser. No. 176,335, Mar. 31, 1988, abandoned.

[30] Foreign Application Priority Data

Apr. 3, 1987 [FR] France ............... 87 04721

[51] Int. Cl.[5] ............................................. H03K 5/153
[52] U.S. Cl. ..................................... 307/350; 307/363
[58] Field of Search ................................ 307/350, 363

[56] References Cited

U.S. PATENT DOCUMENTS

| | | | |
|---|---|---|---|
| 4,626,704 | 12/1986 | Takata et al. | 307/350 |
| 4,658,156 | 4/1987 | Hashimoto | 307/350 |
| 4,709,165 | 11/1987 | Higuchi et al. | 307/350 |
| 4,709,172 | 11/1987 | Williams | 307/350 |

FOREIGN PATENT DOCUMENTS

| | | |
|---|---|---|
| 0102618 | 3/1984 | European Pat. Off. . |
| 2930424 | 2/1980 | Fed. Rep. of Germany . |
| 2254792 | 7/1975 | France . |
| 2128831 | 5/1984 | United Kingdom . |

Primary Examiner—John Zazworsky
Attorney, Agent, or Firm—Oblon, Spivak, McClelland, Maier & Neustadt

[57] ABSTRACT

A circuit for detecting the high voltage level of a voltage $V_{cc}$ in MOS technology comprises a voltage source made of at least one P-type MOS transistor and one N-type MOS transistor, and delivers an output voltage VA such that: $0 < VA < VTN$ if $V_{cc} \leq C$ and $VA = V_{cc} - C + VTN$ if $V_{cc} > C$, VTN being the threshold voltage of the N-type transistor and C being a substantially constant voltage. The circuit further comprises means for delivering an output logic level which switches over when the high voltage level of the voltage $V_{cc}$ exceeds a predetermined threshold, said means being connected to the voltage source. The invention can be applied to EPROMs or EEPROMs.

7 Claims, 2 Drawing Sheets

CIRCUIT FOR DETECTING HIGH VOLTAGE LEVEL IN MOS TECHNOLOGY

This application is a continuation of application Ser. No. 07/176,335, filed on Mar. 31, 1988, now abandoned.

BACKGROUND OF THE INVENTION

1. Field of the Invention

The present invention relates to a circuit for detecting high voltage level in MOS technology.

2. Description of the Prior Art

In a MOS integrated circuit, it is usually very difficult to precisely detect high voltage level, such as the supply voltage. This is because the transistor parameters are determined with a precision of about ±20%, which makes it very difficult to determine a reference voltage. Now, voltage sources are most often made with MOS transistors. Furthermore, the higher the voltage in question, the greater will be the number of variations in the reference voltage level. This is particularly troublesome with MOS integrated circuits such as EPROMs, EEPROMs or similar memories in which a certain voltage $V_{pp}$ is used for programming the cell and another voltage, usually the supply voltage $V_{cc}$, is used for reading the cell. These memories are designed in such a way that they can be programmed with a voltage $V_{pp}$ of about 10 volts. If the read voltage $V_{cc}$ can reach this value, then the states of the memory cells can be changed. Hence the read voltage, namely the supply voltage, has to be limited to a precise value, which, in this case, is smaller than 10 volts.

The object of the present invention is to overcome these drawbacks by providing a circuit for detecting high voltage level in MOS technology, and for delivering a signal when the high voltage level exceeds a predetermined level. This signal may be used to turn off a circuit such as the read circuit in the case of PROMs or EEPROMs.

SUMMARY OF THE INVENTION

According to the present invention, a circuit for detecting high voltage level $V_{cc}$ in MOS technology, comprises a voltage source made with at least one P-type MOS transistor and one N-type MOS transistor, and delivering an output voltage VA such that:

$$0 < VA < VTN \text{ if } V_{cc} \leq C$$

and $$VA = V_{cc} - C + VTN \text{ if } V_{cc} > C$$

VTN being the threshold voltage of the N-type transistor and C being a substantially constant threshold voltage, said circuit further comprising means for delivering an output logic level which switches over when the high voltage level $V_{cc}$ exceeds a predetermined threshold, said means being connected to the voltage source.

According to one embodiment of the present invention, the voltage source comprises n P-type MOS transistors (n being greater than or equal to 1), each made with an N-type pad connected to the source of the corresponding transistor and connected in series between the voltage $V_{cc}$ and the output node A, and of an N-type MOS transistor connected between the output node A and the low voltage or ground, the gates of the P-type and N-type transistors being directly connected to the drain or source of the corresponding transistor. Similarly means which is used to deliver an output logic level which switches over when the high voltage level $V_{cc}$ exceeds a predetermined threshold, comprises a first N-type MOS transistor having its gate connected to the voltage source, its source connected to the low voltage or ground via means for raising its voltage as soon as a current appears, and its drain connected to the supply voltage via switching means and forming the output terminal.

Preferably, said means for raising the voltage of the N-type MOS transistor source comprises another N-type MOS transistor with its gate connected to the voltage $V_{cc}$, its source connected to the low voltage and its drain connected to the source of the first N-type MOS transistor. The switching means comprises a P-type MOS transistor which has its source connected to the voltage $V_{cc}$, its gate to the low voltage or ground and its drain connected to the drain of the first transistor. In this case, the P-type MOS transistor has a W/L ratio which is smaller than 1, and the first N-type MOS transistor has a W/L ratio which is far greater than 1 so that either the voltage $V_{cc}$ or the low voltage $V_{ss}$ or ground is delivered at the output terminal, depending on whether the first N-type MOS transistor is conductive or not.

Preferably, the output of means for delivering an output logic level that switches over when the high voltage level of the supply voltage exceeds a predetermined threshold, is connected to an inverter. In this case, the switching means may comprise a first P-type MOS transistor, with its source connected to the voltage $V_{cc}$, its gate connected to the output of the inverter, and its drain connected to the input of the inverter, and further comprises a second P-type MOS transistor, connected in parallel with the first MOS transistor, with its gate connected to receive a signal that initialises the circuit. The first P-type MOS transistor will be on or off depending on the output signal of the inverter and the second P-type MOS transistor is used to initialise the circuit.

BRIEF DESCRIPTION OF THE DRAWINGS

Other features and advantages of the present invention will appear from the following description of various embodiments, made with reference to the appended drawings, of which.

For the sake of clarity, the same references are repeated for the same elements in both figures.

DESCRIPTION OF PREFERRED EMBODIMENTS

Figure 1:
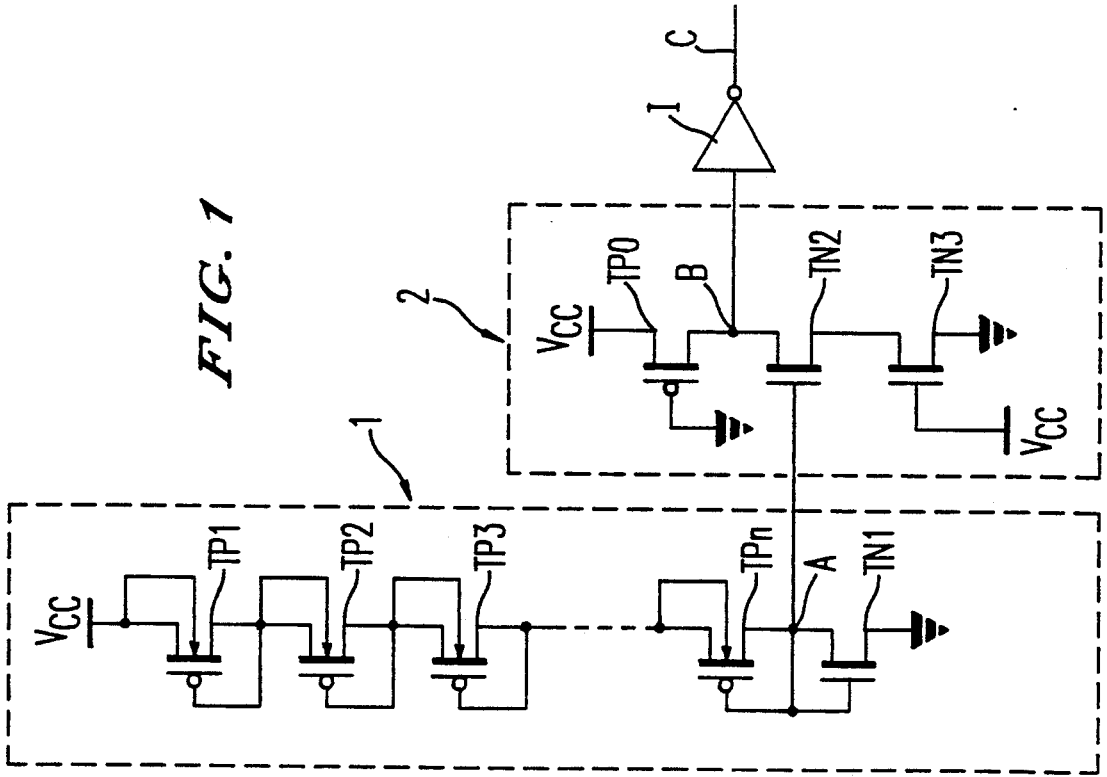
FIG. 1 is an electrical diagram of a first embodiment of a detection circuit according to the present invention.
Figure 1A:
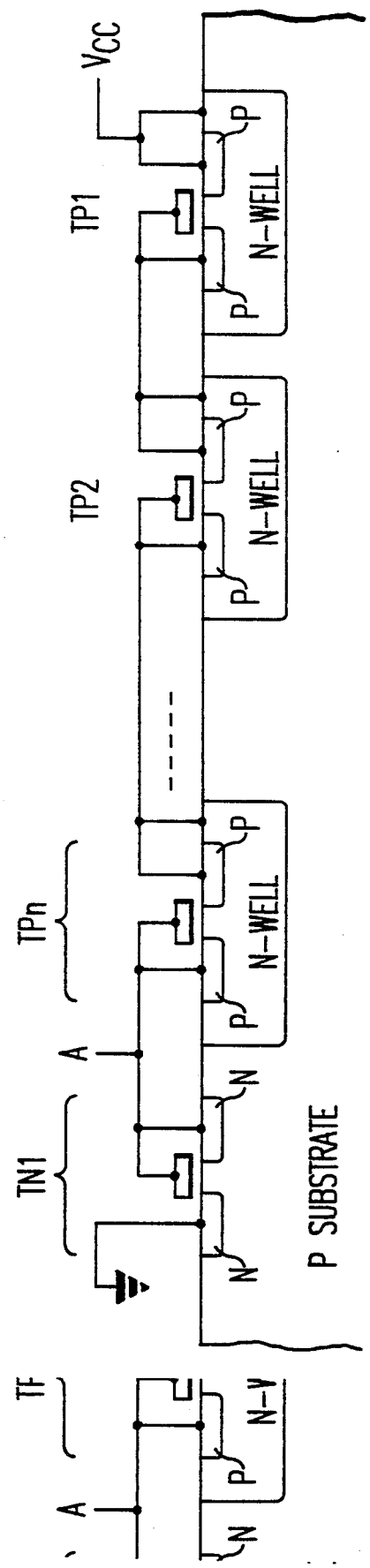
FIG. 1A shows the well structure for the transistor of the voltage source 1 of FIG. 1.

As shown in FIG. 1, a circuit for detecting a high voltage level in a MOS technology, according to the present invention, comprises a voltage source 1, means for delivering an output logic level that switches over when the high voltage level $V_{cc}$ exceeds a predetermined threshold and, if necessary, an inverter I. More specifically, the voltage source 1 comprises of n series-connected P-type MOS transistors, TP1, TP2, TP3 ... TPn, and an N-type MOS transistor TN1 as specifically illustrated in FIG. 1A. The number n of P-type transistors is chosen, firstly, according to the voltage $V_{cc}$, for which the high level must be detected, and, secondly, according to the threshold voltage of the various transistors.

More specifically, the P-type transistor TP1 is connected so that its source is connected to the voltage $V_{cc}$ and its drain is connected to the source of the P-type transistor TP2, the drain of which is connected to the source of the P-type transistor TP3, and so on. The drain of the P-type transistor TPn is connected to a node A which is the output terminal of the voltage source. Furthermore, the gates of the transistors TP1 to TPn are each connected to the drain of the corresponding transistor. According to the present invention, each transistor TP1 to TPn is made in a separate N-type well, and each well is connected to the source of the corresponding P-type transistor. Consequently, the threshold voltage of the P-type transistors is precisely determined because the substrate effect, namely the variation in the threshold voltage as a function of the source/substrate voltage, is eliminated. Furthermore, the voltage source has an N-type transistor TN1 with its source connected to a low voltage $V_{ss}$ or to ground and its drain connected to the output node A. The gate of the transistor TN1 is connected to its drain. Preferably, the transistors TP1 to TPn have the same threshold voltage.

In this case, the voltage at the node A will be between $V_{ss}$ and VTN if $V_{cc} < n.\text{VTP} + \text{VTN}$ (transistors TN1 and TPn are off), and it will be equal to $V_{cc} - n.\text{VTP}$ if $V_{cc} > n.\text{VTP} + \text{VTN}$, with VTP representing the threshold voltage of the P-type transistors and VTN representing the threshold voltage of the N-type transistor.

This voltage source 1 is connected to means 2 comprising a first N-type transistor TN2 with its source connected to the low voltage or ground via a second N-type MOS transistor TN3, the gate of which is connected to $V_{cc}$, thus keeping it always on. Furthermore, the drain of the transistor TN2 is connected to the drain of a P-type transistor TP0, the source of which is connected to $V_{cc}$ and the gate of which is connected to the low voltage or ground. A node B between the transistors TP0 and TN2 is taken as this output terminal of means 2. Preferably, as shown in FIG. 1, the node B is connected to an inverter I and the output signal of the detection circuit is taken at the inverter output terminal C. We shall now explain the operating mode of the detection circuit shown in FIG. 1.

With the circuit shown in FIG. 1, it is possible to detect a voltage $V_{cc}$ equal to $n.\text{VTP} + \text{VTN}$. If the voltage $V_{cc}$ is lower than $n.\text{VTP} + \text{VTN}$, there is no direct current in any of the branches. The voltage at the node A is lower than VTN, i.e. lower than the threshold voltage of the N-type transistor TN1. Consequently, the transistor TN2 is off. Furthermore, the node B is at $V_{cc}$. Because the transistor TP0, which has its gate connected to the ground, is conductive and applies the voltage $V_{cc}$ at the point B. The transistor TN3, the gate of which receives the voltage $V_{cc}$, is also conductive, and prevents conduction of the transistor TN2 by raising its source voltage as soon as a current flows.

If the voltage $V_{cc}$ exceeds $n.\text{VTP} + \text{VTN}$, the voltage at node A increases and follows the rise of $V_{cc}$. Then, transistor TN2 turns on and forces node B to be at $V_{ss}$. As the transistor TN2 has been designed so that its W/L ratio is far greater than 1 while the W/L ratio of the transistor TP0 is far smaller than 1, this conduction of transistor TN2 forces the voltage $V_{ss}$ on node B. For example, in two-micron C-MOS technology, the P-type MOS transistor TP0 has a W/L ratio of 2/25 while the N-type MOS transistor TN2 has a W/L ratio of 10/2. With the node B at $V_{ss}$ (i.e. at logic "0") a logic state "1" is present at the output terminal C of the inverter I, namely a detection signal which can be used to turn a circuit off.

Figure 2:
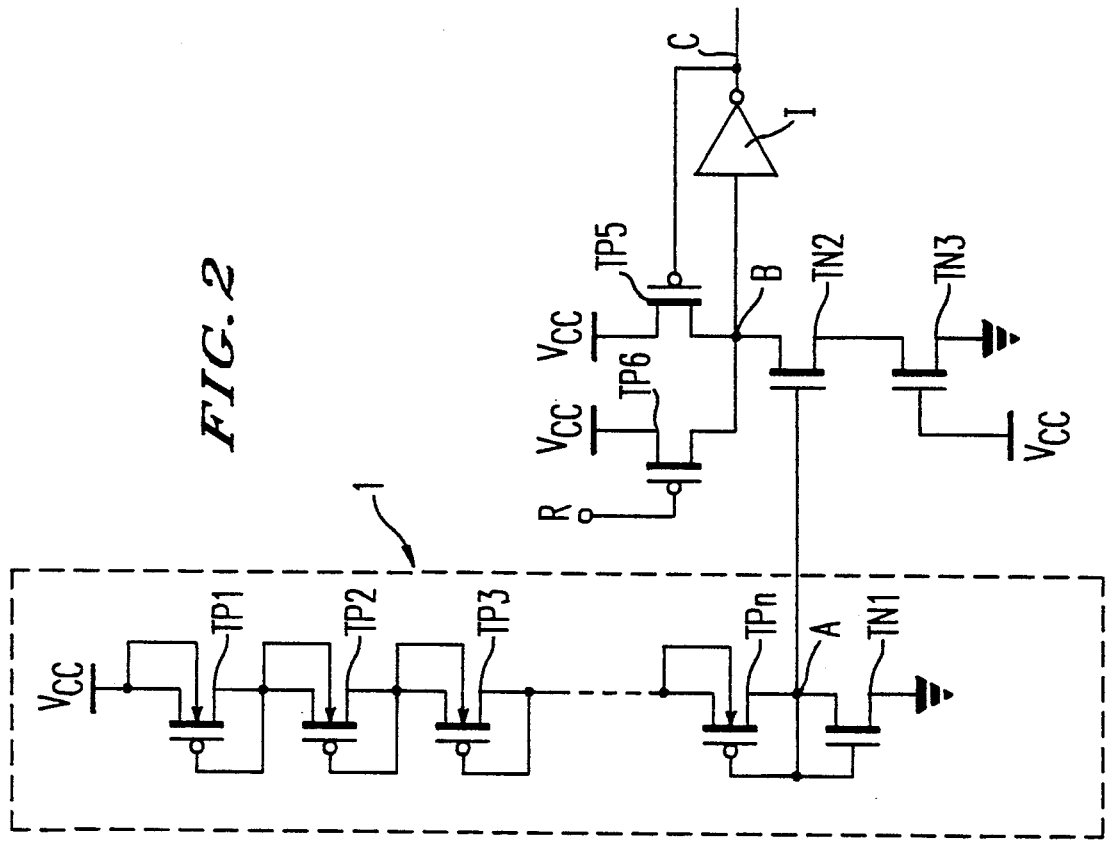
FIG. 2 is an electrical diagram of a second embodiment of a detection circuit according to the present invention.

To turn off the P-type transistor TP0 as soon as a voltage $V_{cc}$ greater than $n.\text{VTP} + \text{VTN}$ is detected, the circuit shown in FIG. 2 can be used. In this case, the inverter I is an integral part of the high voltage level detection circuit, and the gate of the P-type transistor TP5, used instead of the transistor TP0, is connected to the output terminal C of the inverter I instead of being connected to the low voltage or ground. However, to initialise the system, a P-type transistor TP6 is used, with its source connected to the voltage $V_{cc}$ and its drain connected to the node B, the gate of the transistor TP6 being connected so as to receive a reset signal R. This transistor TP6 is used to position the node B at the voltage $V_{cc}$ when the detection circuit starts operating. Then, as soon as this node goes to $V_{ss}$, the level at the inverter output terminal C goes to logic state "1": this turns the transistor TP5 off and keeps the node B at $V_{ss}$.

The circuit described above with reference to the FIGS. 1 and 2 has several advantages:

the detection voltage is such that $V = (n.VTP + VTN) \pm 10\%$.

As the threshold voltages of P-type transistors or N-type transistors are usually checked with high precision, especially when a highly stable manufacturing process is used.

the static consumption of the circuit is nil until it is detected that the voltage $V_{cc}$ has exceeded the predetermined threshold. In normal operation, the above circuit is not used. In integrated circuits for monetary applications, it can be used as a safety device.

What is claimed is:

1. A device for detecting a high threshold voltage of a supply voltage in a circuit constructed by MOS technology on a substrate, said device comprising, between a supply connection which receives said supply voltage and a ground connection, a serially connected arrangement of a first conductivity type first transistor (TN1) and a reference voltage source, said reference voltage source comprising a plurality of transistors of a second conductivity type opposite said first type, each of said plurality of transistors being made into a respective separate well made in said substrate, said well connected to a source electrode of a respective one of said transistors made in this well, each of said plurality of transistors having a gate electrode and a drain electrode connected together.

2. A device according to claim 1, further comprising a second transistor of said first conductivity type, having a gate electrode, a source electrode and a drain electrode, said gate connected to a junction point between said first transistor of the first type of conductivity and the voltage reference source, said source electrode being connected to the ground connection through means capable of increasing the voltage across itself when it is fed by a current, and said drain electrode constitutes an output of the device and is connected to the supply connection through a switch.

3. A device according to claim 2, wherein said means capable of increasing its voltage is a third transistor of the first conductivity type having a gate electrode a source electrode and a drain electrode, said gate electrode connected to the supply connection, said source electrode connected to ground, and said drain electrode connected to the source electrode of said second transistor of said first type.

4. A device according to claim 2, wherein said switch comprises a MOS transistor of said second conductivity type having a gate electrode, a source electrode and a drain electrode, said source electrode being connected to the supply connection, said gate connected to ground, and said drain connected to the drain of the second transistor of the first conductivity type.

5. A device according to claim 4, wherein said MOS transistor of said switch has a channel width to length ratio much lower than 1 and the second transistor of said first type of conductivity has a channel width to length ratio much greater than 1.

6. A device according to claim 5, wherein said channel, width to length ratio much lower than 1 is substantially 0.1 and the channel width to length ratio much greater than 1 is substantially 5.

7. A device according to claim 2 wherein said switch comprises:
 a transistor of the second type of conductivity having a source electrode connected to the supply connection, a gate electrode connected to an output of an inverter, and a drain electrode connected to an input of said inverter, said input also connected to the drain of the second transistor of said first conductivity type, and
 an additional transistor of said second conductivity type having a source electrode and a drain electrode respectively connected to the source and drain electrodes of the first mentioned transistor of said switch, said other transistor having a gate for receiving a starting signal upon powering of the circuit so as to be temporarily rendered conductive and thereafter blocked.

* * * * *